United States Patent [19]
Rodriques Ramalho

[11] Patent Number: 5,668,504

[45] Date of Patent: Sep. 16, 1997

[54] FREQUENCY SYNTHESIZER

[75] Inventor: Rui Paulo Rodriques Ramalho, Grenoble, France

[73] Assignee: SGS-Thomson Microelectronics S.A., Saint Genis, France

[21] Appl. No.: 678,486

[22] Filed: Jul. 9, 1996

[30]    Foreign Application Priority Data

Jul. 13, 1995 [FR] France ..................... 95 08760

[51] Int. Cl.$^6$ .............. H03L 7/06; H03L 7/099; H03K 5/00
[52] U.S. Cl. .............. 331/1 A; 331/57; 331/74; 327/145; 327/147; 327/151
[58] Field of Search ................... 331/1 A, 2, 45, 331/55, 57, 74, 175, 177 R; 327/144–153

[56]          References Cited

U.S. PATENT DOCUMENTS 4,868,522   9/1989   Popat et al. .................. 331/2
5,157,276  10/1992   Metz ........................... 327/144
5,448,191   9/1995   Meyer .......................... 327/105

OTHER PUBLICATIONS

French Search Report from French Patent Application 95 08760, filed Jul. 13, 1995.

*Primary Examiner*—David Mis
*Attorney, Agent, or Firm*—Wolf, Greenfield & Sacks, P.C.; James H. Morris

[57]          ABSTRACT

A frequency synthesizer including a phase-locked loop, an oscillator of which supplies n phases with increasing delays of a fast clock signal synchronized on a reference frequency, each of said n phases being sent onto a same number m of fractional dividers having their respective outputs sent onto m jitter compensators which each issue, based on said n phases, a clock signal synchronized on said reference frequency.

9 Claims, 5 Drawing Sheets

5,668,504

1

FREQUENCY SYNTHESIZER

BACKGROUND OF THE INVENTION

1. Field of the Invention

The present invention relates to a circuit for generating several clocks at different frequencies. The invention more specifically applies to the realization of a frequency synthesizer adapted for integration in a circuit, the operation of which requires the use of several clocks synchronized on a same reference frequency.

2. Discussion of the Related Art

As an example of application, a synthesizer according to the invention can be integrated in a decoder of video and audio signals compressed according to a so-called MPEG standard for display on a television set. Such a decoder requires several clocks for the different blocks it includes and all these clocks have to be synchronized on a reference frequency. For example, two first clocks ere for an audio decoding block, a third clock is for a video decoding block, a fourth clock is for a display generating block, etc. All these clocks have different frequencies included, for instance, between 10 and 100 MHz, and have to be synchronized on a same reference frequency, for instance a sampling frequency of the image pixels of some ten MHz.

Conventionally, these clocks are generated outside the MPEG decoder and separately by assigning a phase-locked loop (PLL) to each frequency to be generated.

SUMMARY OF THE INVENTION

One object of the present invention is to provide a frequency synthesizer for issuing several clock signals from a same phase-locked loop issuing a fast clock signal synchronized on a reference frequency.

Another object of the invention is to minimize the possible phase jitter of the different clock signals issued with respect to the fast frequency issued by the PLL.

To achieve these and other objects, the present invention provides a frequency synthesizer including a phase-locked loop having one oscillator which supplies an odd number n of phases with increasing delays of a fast clock signal synchronized on a reference frequency, each of said n phases being sent on a same number m of programmable fractional dividers having their respective outputs sent on m phase jitter compensators, each of which issues, based on said n phases, a clock signal synchronized on said reference frequency.

According to an embodiment of the present invention, each fractional divider includes a programmable digital divider which issues an output signal at a frequency corresponding, modulo the denominator of the fractional division ratio, to the fast frequency divided by said fractional ratio, and a programmable accumulator which issues n−1 signals indicating the position of each rising edge of said output signal of the digital divider with respect to the quotient, by the number n of phases, of the denominator of said fractional ratio.

According to an embodiment of the present invention, said accumulator configures said digital divider between an operating mode where it divides said fast frequency by the integer part of said fractional division ratio and an operating mode where it divides said fast frequency by said integer part plus one, said accumulator being synchronized by said output signal of said digital divider.

According to an embodiment of the present invention, the integer part of the fractional division ratio is at least equal to 3.

2

According to an embodiment of the present invention, the digital divider is programmed by said integer part, minus one, and receives the phase used by the fractional divider in which it is integrated, the accumulator being programmed by the denominator of the fractional division ratio as well as by the remainder of the division of the numerator of said fractional ratio by said denominator.

According to an embodiment of the present invention, each phase jitter compensator includes a switch, with n inputs and one output, controlled by n signals issued by n D flip-flops sampled by the output signal of the digital divider with which the compensator is associated, each control flip-flop receiving an output of a logic decoder which receives, as an input, the n−1 signals issued by the accumulator.

According to an embodiment of the present invention, each input of the switch is connected to an output of a dephasing D flip-flop, a first dephasing flip-flop being controlled by the phase of the fast frequency which is used by the fractional divider associated with the compensator involved, the other dephasing flip-flops being each controlled by another one of said phases of the fast frequency.

According to an embodiment of the present invention, all the jitter compensators and all the fractional dividers included in the frequency synthesizer have an identical constitution, two stages of the synthesizer being distinguished by the phase received by the first dephasing flip-flop of their jitter compensator and/or by the values introduced to program their fractional divider.

According to an embodiment of the present invention, said oscillator of the phase-locked loop issues three phases of the fast frequency.

These objects, features and advantages, as well as others, of the present invention will be discussed in detail in the following description of specific embodiments, taken in conjunction with the following drawings, but not limited by them.

DETAILED DESCRIPTION

Figure 6:
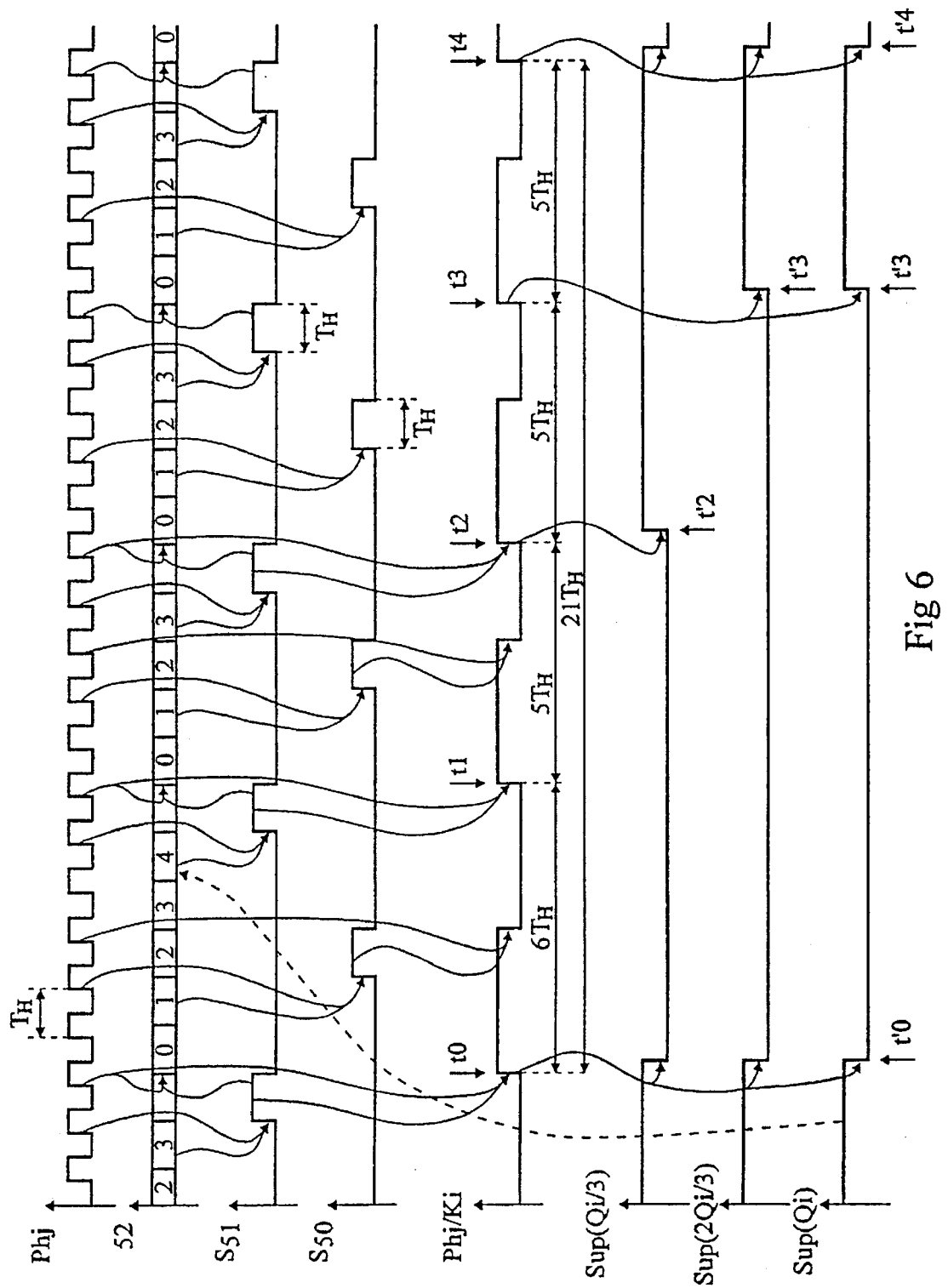
FIG. 6 illustrates, in the form of timing diagrams, the operation of a fractional divider as shown in FIGS. 3 to 5.
Figure 8:
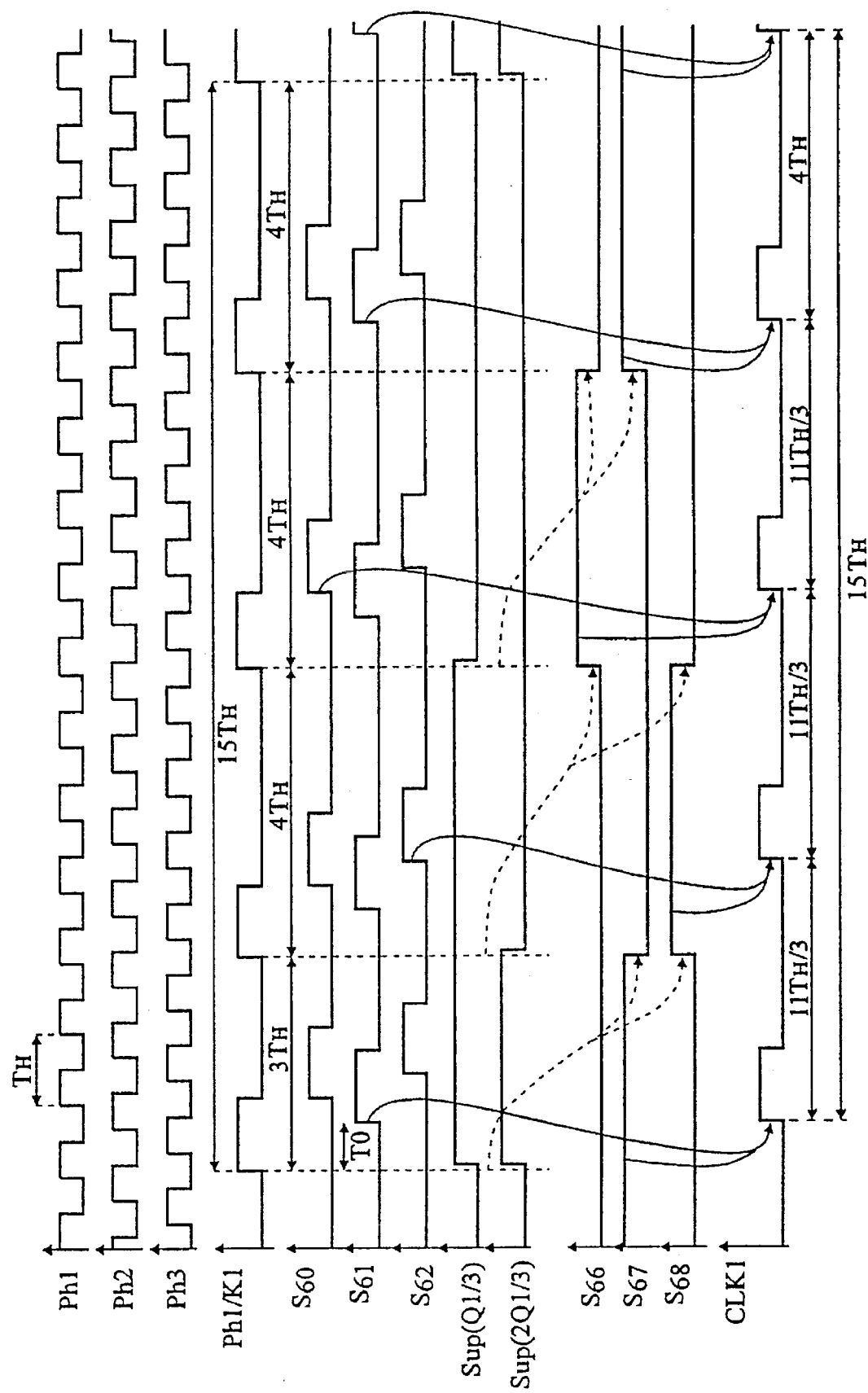
FIG. 8 illustrates, in the form of timing diagrams, the operation of a stage of a frequency synthesizer according to the invention as shown in FIG. 1.

For clarity, the same components have been referred to by the same references in the different drawings. For added clarity, the timing diagrams of FIGS. 6 and 8 are not to scale.

A frequency synthesizer, according to the present invention, is meant to generate several clock signals synchronized on a same reference frequency and from a same phase-locked loop (PLL).

Figure 1:
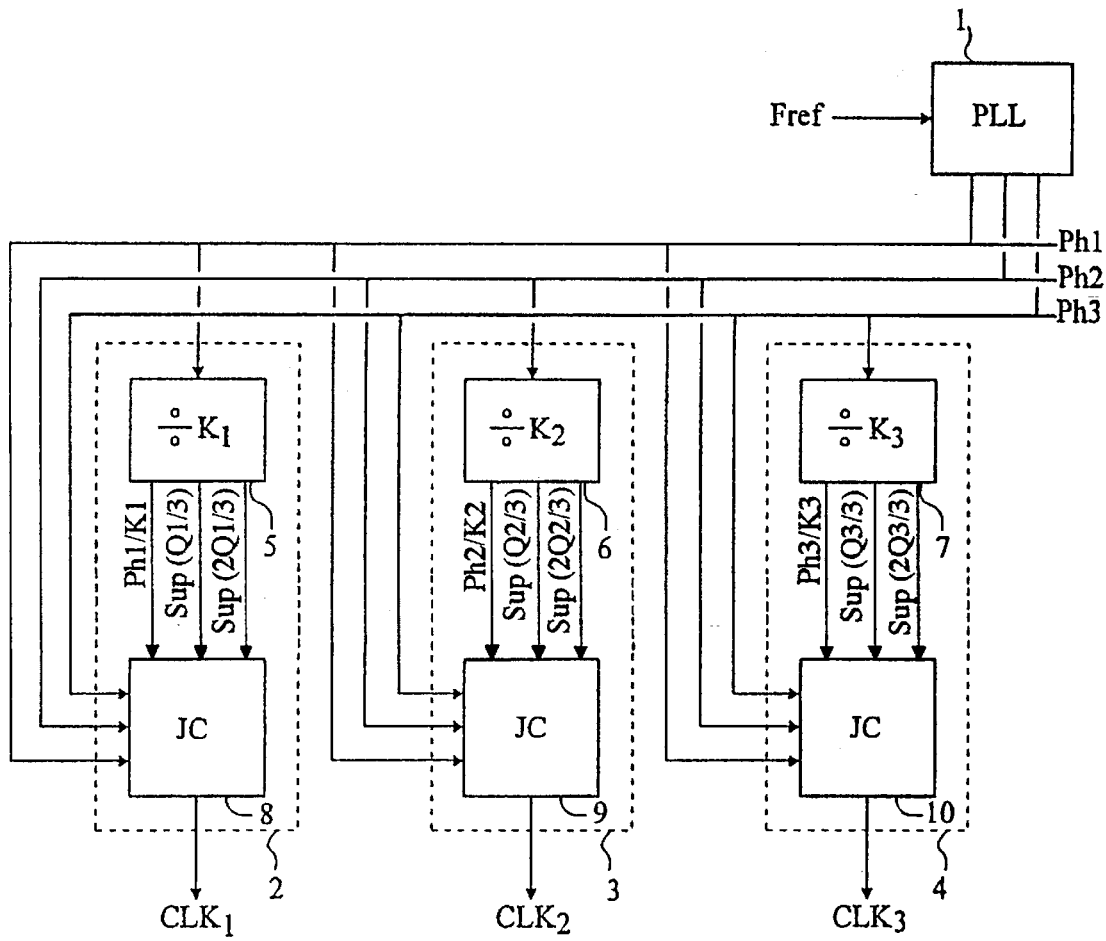
FIG. 1 schematically shows an embodiment of a frequency synthesizer according to the invention.

As shown in FIG. 1, a frequency synthesizer thus includes a PLL 1 associated with several stages, each of which is meant to generate a clock signal of rank i. In the example shown, three clock signals $CLK_1$, $CLK_2$ and $CLK_3$ are generated by three stages, respectively 2, 3 and 4, of the synthesizer.

PLL 1 is, for instance, a conventional analog PLL, the oscillator of which is made for delivering several phases of rank j of a fast clock signal at a frequency $F_H$. In the example shown, three phases $Ph_1$, $Ph_2$ and $Ph_3$ of fast frequency $F_H$ are issued by PLL 1.

According to the invention, each stage 2, 3 or 4 is constituted by a programmable fractional divider, respectively 5, 6 or 7, with a division ratio, respectively $K_1$, $K_2$ or $K_3$, depending on the desired frequency for each clock signal $CLK_i$. Each fractional divider 5, 6 or 7 is associated with a jitter compensator, respectively 8, 9 or 10. The role of each jitter compensator, respectively 8, 9 or 10, is to compensate the possible phase jitter on each signal at frequency $Ph_1/K_1$, $Ph_2/K_2$ or $Ph_3/K_3$ from each fractional divider, respectively 5, 6 or 7. In other words, the frequency of signal $Ph_j/K_i$ issued by one of dividers 5, 6 or 7 has a jitter equal to period $T_H$ of fast frequency $F_H$. The role of compensator 8, 9 or 10 then is to resynchronize signal $Ph_j/K_i$ by shifting it by two thirds, three thirds or four thirds of a period $T_H$ of fast frequency $F_H$ issued by PLL 1. The phase jitter of the clock signals issued $CLK_i$ then is, according to the invention, limited to one third of period $T_H$ of fast frequency $F_H$.

Figure 7:
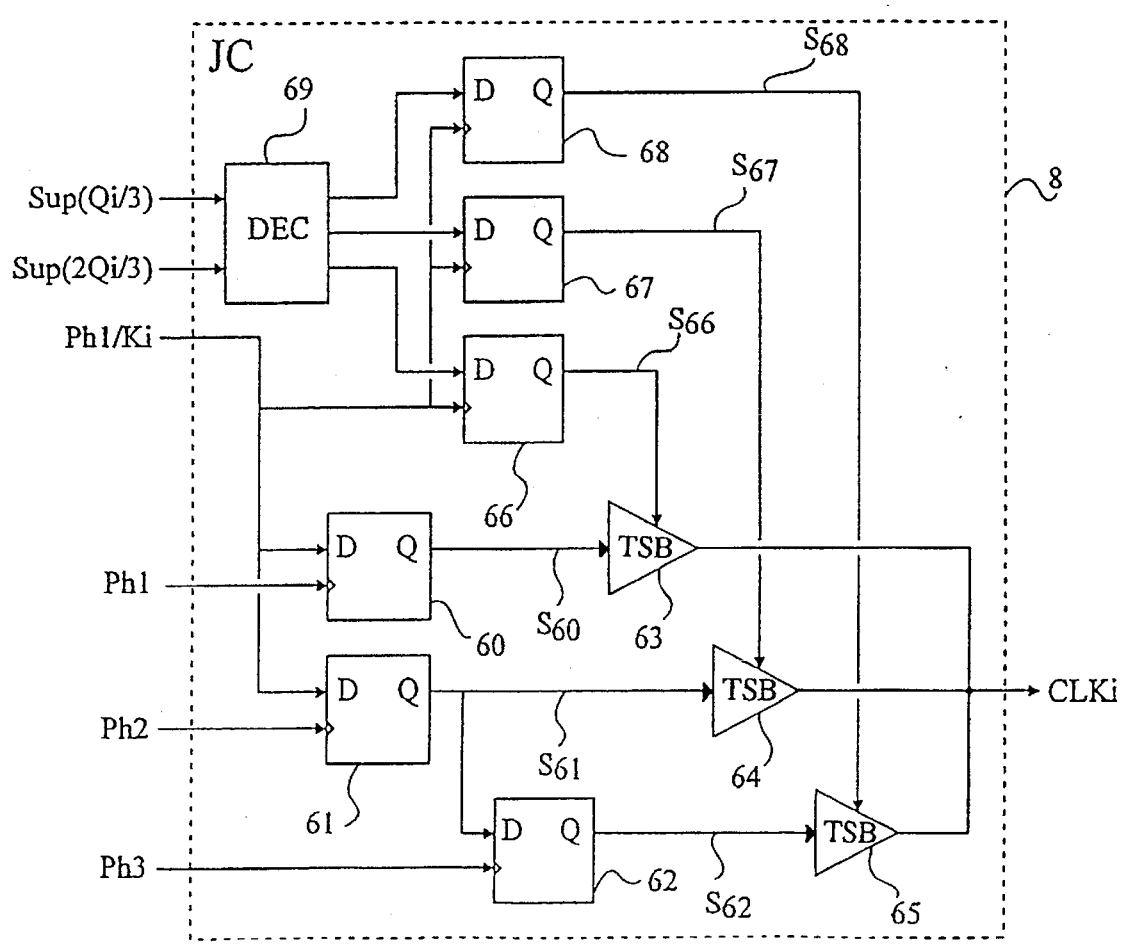
FIG. 7 shows an embodiment of a jitter compensator of a stage of a frequency synthesizer as shown in FIG. 1.

The operation of a jitter compensator according to the invention will be better understood in conjunction with FIGS. 7 and 8.

According to the invention and in the example shown, each jitter compensator 8, 9 or 10 is controlled by two signals $SUP(Q_i/3)$ and $SUP(2Q_i/3)$ from the associated fractional divider, respectively 5, 6 or 7. The shape and the function of these two signals $SUP(Q_i/3)$ and $SUP(2Q_i/3)$ will be better understood in conjunction with FIGS. 3 and 6.

Figure 2:
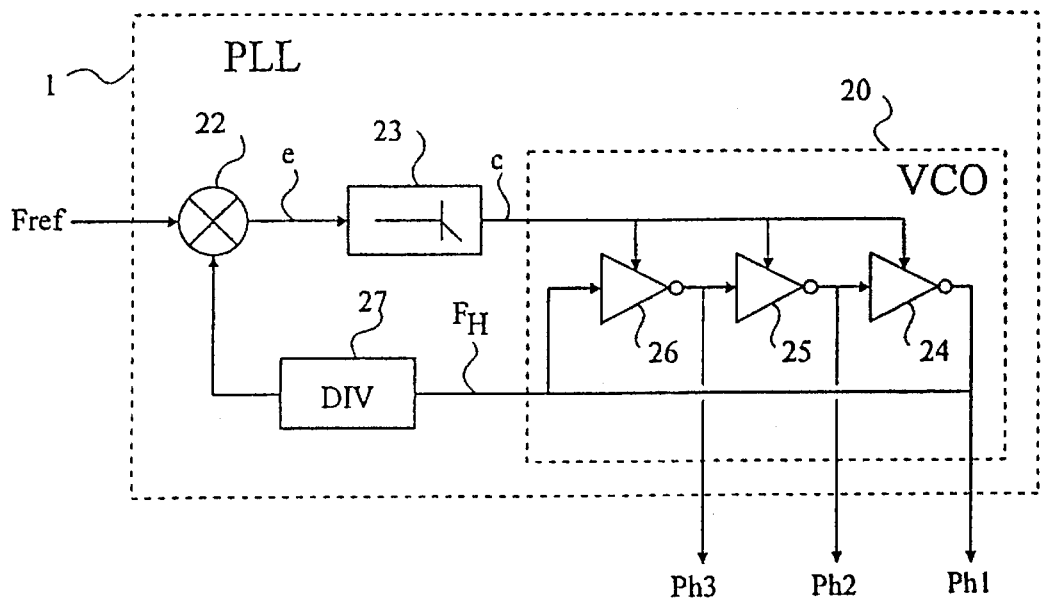
FIG. 2 shows an embodiment of a phase locked-loop of the frequency synthesizer shown in FIG. 1.

As shown in FIG. 2, PLL 1 includes a voltage controlled oscillator (VCO) 20 which issues a fast frequency $F_H$. Fast frequency $F_H$ is synchronized on a reference frequency $F_{ref}$ by means of a phase comparator 22 which issues a jitter signal e to a filter 23, the output c of which controls oscillator 20. An oscillator 20 issuing an odd number n (here, n=3) of clock signals, respectively $Ph_1$, $Ph_2$ and $Ph_3$, at frequency $F_H$ is used. A clock signal $Ph_j$, called clock phase, is delayed, with respect to the preceding one $Ph_{j-1}$ and in the example shown, by two thirds of period $T_H$ of fast frequency $F_H$. Oscillator 20 is, for instance, a ring oscillator with n (here, n=3) inverters, respectively 24, 25 and 26, with their supply current being set by control signal c from filter 23. At the outputs of inverters 24, 25 and 26, the respective clock phases $Ph_1$, $Ph_2$ and $Ph_3$ are taken. Phase $Ph_1$ is supplied to a frequency divider 27 having its output sent to phase comparator 22. Because of the feedback of the output of inverter 24 to the input of inverter 26, phase $Ph_3$ is delayed by $2T_H/3$ with respect to phase $Ph_2$, which is itself delayed by $2T_H/3$ with respect to phase $Ph_1$. A phase (for example $Ph_2$) is delayed by one third of period $T_H$ with respect to the closest phase (for example $Ph_3$) in the flow direction of the ring oscillator.

A characteristic of the present invention is that the frequency synthesizer includes a same number m of stages associated to each phase $Ph_j$ of frequency $F_H$ issued by PLL 1. In other words, the number of stages of a frequency synthesizer according to the invention is an integer multiple m of the number n of phases $Ph_j$ issued by PLL 1, and the output of each inverter 24, 25 or 26 of oscillator 20 is sent to a same number m (in FIG. 1, m=1) of stages.

An advantage of such an architecture is that it ensures a charge balance at the outputs of inverters 24, 25 or 26 of oscillator 20. The delay introduced by each inverter 24, 25 or 26 is thus guaranteed to effectively correspond to one third of period $T_H$ of fast frequency $F_H$. It is so ensured that each inverter 24, 25 or 26 introduces the same delay and, consequently, that the phase jitter of clock signals $CLK_i$ is really limited to one third of the period of frequency $F_H$.

Although, for reasons of clarity, only three stages 2, 3 and 4 have been shown in FIG. 1, the synthesizer can include a higher number of stages. Taking the preceding facts into account, the number of stages is, in this example, a multiple of three, since oscillator 20 of the PLL issues three phases $Ph_1$, $Ph_2$ and $Ph_3$.

For the case where period $T_H$ of fast frequency $F_H$ imposes the use of a higher number of inverters as a function of the delay introduced by each inverter, two alternative embodiments can be implemented according to the invention.

A first alternative includes increasing the number n of phases $Ph_j$ issued by PLL 1 while always making sure that the output of each inverter is connected to a same number m of stages of the synthesizer.

A second alternative includes assuming that an inverter 24, 25 or 26 is in fact constituted by several inverters, with the number of inverters constituting inverters 24, 25 or 26 being the same. The phases $Ph_j$ of fast frequency $F_H$ are thus taken at regular intervals, for instance every two or three inverters.

Other conventional types of oscillators 20 can also be used, as long as they issue the desired number n of phases $Ph_j$ of fast frequency $F_H$, all phases $Ph_j$ being delayed by a same quotient $1/n$ of period $T_H$ of fast frequency $F_H$ with respect to the closest phase. For example, it will be possible to use a phase-locked loop 1, the VCO of which is itself constituted by an auxiliary phase-locked loop of a fast frequency from an ring oscillator on a frequency issued by a quartz oscillator. Such an embodiment can be utilized, for instance, if the desired fast frequency is high (around several hundreds of MHz) and if the reference frequency is low (around some ten kHz).

Figure 3:
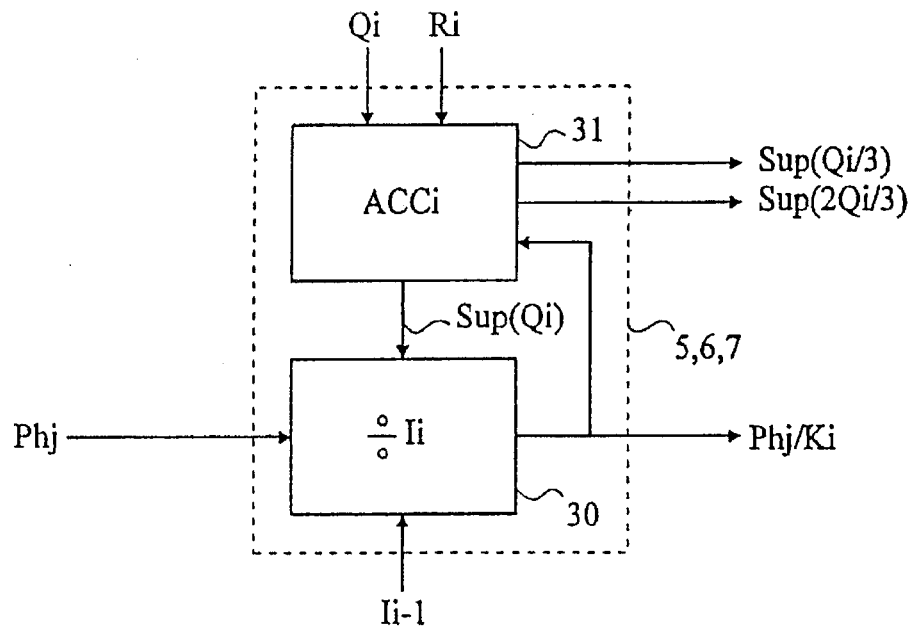
FIG. 3 shows, in the form of a block diagram, an embodiment of a fractional divider of a stage of the frequency synthesizer as shown in FIG. 1.

FIG. 3 shows the structure of an embodiment of a fractional divider 5, 6 or 7 (FIG. 1) according to the invention.

The role of such a divider according to the invention is to supply, on the one hand, a signal $Ph_j/K_i$ having a frequency corresponding to the desired frequency for the clock signal $CLK_i$ associated with divider 5, 6 or 7 and, on the other hand, the control signals $SUP(Q_i/3)$ and $SUP(2Q_i/3)$ of the jitter compensator 8, 9 or 10 associated with the divider, respectively 5, 6 or 7.

To obtain a fractional division with a ratio $K_i=P_i/Q_i$, where $P_i$ and $Q_i$ stand for integers, a division by $I_i+R_i/Q_i$ is performed, where $I_i$ stands for the integer part of quotient $P_i/Q_i$ and where $R_i$ stands for the remainder of the quotient, that is, $P_i-I_iQ_i$.

The fractional division is performed by counting the cycles of clock phase $Ph_j$ and by converting each cycle into a cycle of frequency $F_H/I_i$ or $F_H/(I_i+1)$. This transformation is performed within a programmable digital divider 30, an example of realization of which will be discussed in relation with FIG. 5. For each cycle of frequency $F_H/I_i$, the value of $R_i$ is added to a value contained within a programmable accumulator $ACC_i$ 31 and the resulting value is compared with denominator $Q_i$ of ratio $K_i$. When the accumulated value reaches denominator $Q_i$, a cycle of clock phase $Ph_j$ is added to the following cycle, which thus has a frequency of $F_H/(I_i+1)$. For the cycle involved, this corresponds to dividing a cycle of clock phase $Ph_j$ by $I_i+1$. The signal $Ph_j/K_i$ issued by the fractional divider thus includes, with a periodicity corresponding to denominator $Q_i$, $R_i$ cycles of period $(I_i+1)T_H$ and $Q_i-R_i$ cycles of period $I_iT_H$.

For this purpose, digital divider 30 receives, besides clock phase $Ph_j$, a value $I_i-1$ which is predefined according to the desired division ratio $K_i$ and a signal $SUP(Q_i)$ indicating that value $Q_i$ has been exceeded within accumulator 31. Divider 30 issues a signal at frequency $Ph_j/K_i$, modulo $Q_i$, for accumulator 31 and the jitter compensator 8, 9 or 10 associated with the fractional divider, respectively 5, 6 or 7.

Accumulator 31 receives, besides signal $Ph_j/K_i$, values $R_i$ and $Q_i$ which are values predefined according to the desired division ratio $K_i$. $Q_i$ is a value over q bits and $R_i$ is a value over r bits, r being lower than or equal to q since $R_i$ is lower than $Q_i$, as the remainder of division $P_i/Q_i$. Accumulator 31 issues, besides signal $SUP(Q_i)$ for digital divider 30, the two signals $SUP(Q_i/3)$ and $SUP(2Q_i/3)$ for the jitter compensator 8, 9 or 10 associated with the fractional divider, respectively 5, 6 or 7.

Signals $SUP(Q_i/3)$ and $SUP(2Q_i/3)$ are signals indicating that denominator $Q_i$ has been exceeded, respectively by one third and two thirds, by the value contained within accumulator 31. Their function will be better understood from the following explanation in relation to FIG. 6.

Figure 4:
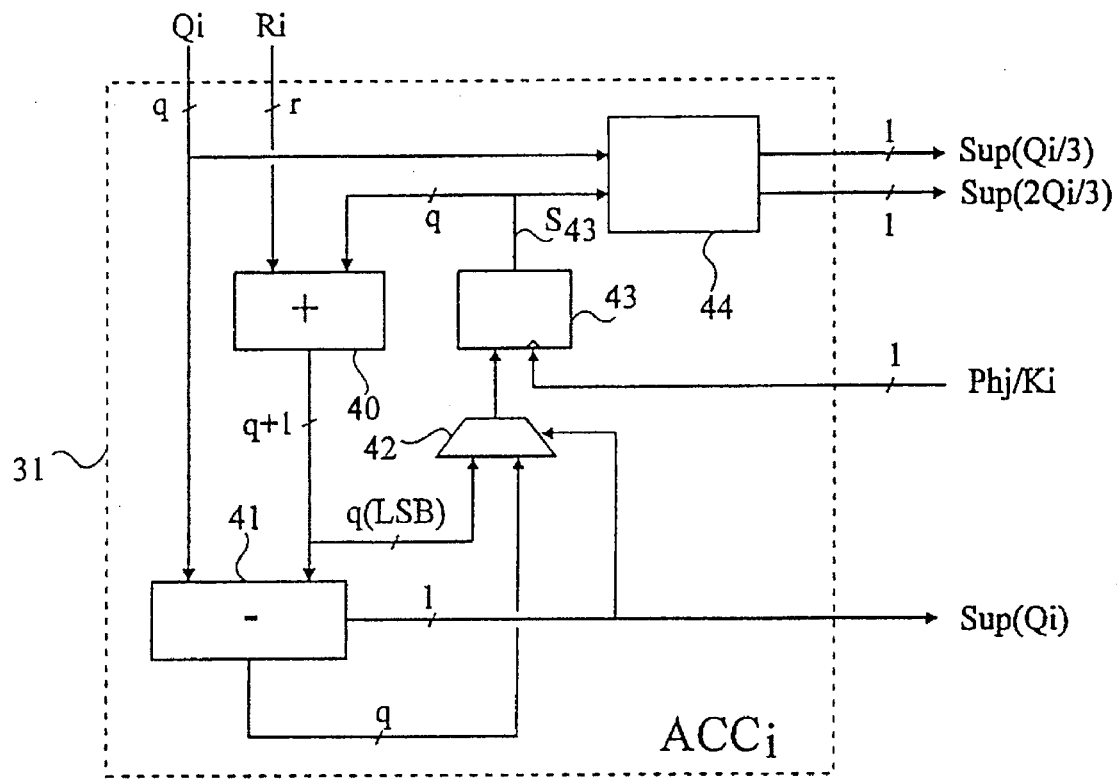
FIG. 4 shows an embodiment of an accumulator of a fractional divider as shown in FIG. 3.

FIG. 4 illustrates an embodiment of an accumulator 31 as shown in FIG. 3.

Accumulator $ACC_i$ 31 is, according to the invention, a modulo-$Q_i$ accumulator. For each cycle of signal $Ph_j/K_i$, value $R_i$ is added to the value present in an adder 40.

A subtractor 41 permanently calculates the resulting value of adder 40 minus denominator $Q_i$. Practically, subtractor 41 calculates the sum of the value issued by adder 40 and of the complement to two of denominator $Q_i$. This enables to use the carry $SUP(Q_i)$ of this operation to control a multiplexer 42 having two inputs receiving the q least significant bits (LSB), respectively of the resulting value issued by adder 40 and of the result issued by subtractor 41. In other words, multiplexer 42 selects the value accumulated in adder 40 as long as this value has not reached denominator $Q_i$. When this value has been reached, multiplexer 42 enables, under control of signal $SUP(Q_i)$, to reset accumulator 31.

A flip-flop 43 enables triggering of the addition for each cycle of signal $Ph_j/K_i$. It should be noted that the result issued by adder 40 extends over q+1 bits since this result corresponds to the accumulation before subtracting $Q_i$. This result can thus reach value $2Q_i-2$.

A comparator 44 receives, on a first input, denominator $Q_i$ and, on a second input, the value $S_{43}$ issued by flip-flop 43, that is, the result of the modulo-$Q_i$ accumulation. Comparator 44 examines the accumulated value with respect to one third and two thirds of denominator $Q_i$. Comparator 44 issues signals $SUP(Q_i/3)$ and $SUP(2Q_i/3)$.

Figure 5:
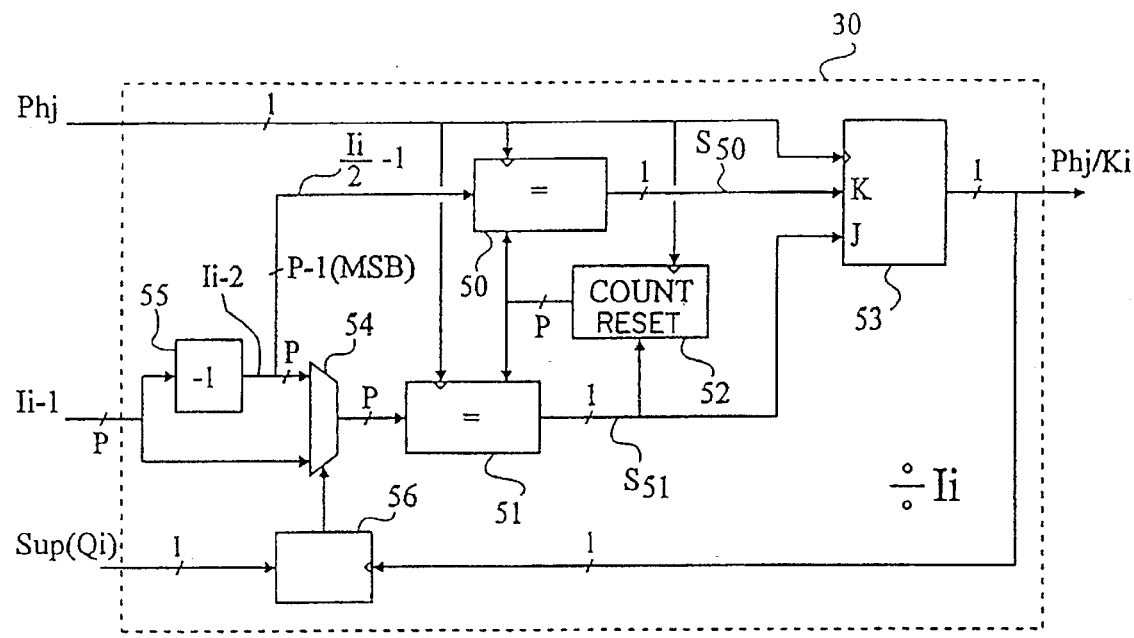
FIG. 5 shows an embodiment of a digital divider of a fractional divider as shown in FIG. 3.

FIG. 5 illustrates an embodiment of a digital divider 30 as shown in FIG. 3.

Divider 30 receives the phase $Ph_j$ whose frequency it must divide. The phase $Ph_j$ is sent onto the clock inputs of two comparators 50 and 51, of a counter 52 and of a JK flip-flop 53 for delivering the signal at frequency $Ph_j/K_i$ modulo $Q_i$.

Divider 30 also receives the predetermined value $I_i-1$, for example programmed on p bits, and the signal $SUP(Q_i)$ from accumulator 31.

A multiplexer 54 receives, on a first input, this value $I_i-1$ and, on a second input, the output of a subtractor 55 receiving, as an input, value $I_i-1$. Subtractor 55 subtracts "1" to value $I_i-1$ and issues value $I_i-2$. Signal $SUP(Q_i)$ is sent onto a flip-flop 56 controlled by signal $Ph_j/K_i$. Multiplexer 54 selects, at each rising edge of signal $Ph_j/K_i$, the value $I_i-2$ for $Q_i-R_i$ cycles of signal $Ph_j/K_i$ and the value $I_i-1$ for $R_i$ cycles of signal $Ph_j/K_i$.

Counter 52 is reset by the output $S_{51}$ of comparator 51 which receives, as an input, the value issued by multiplexer 54 and the result of counter 52. In other words, counter 52 is reset, every $I_i-2$ cycles, by counting an extra cycle when value $Q_i$ is reached. The use of values $I_i-1$ and $I_i-2$ has to do with the fact that the reset of counter 52 is synchronized by phase $Ph_j$. Thus, to count $I_i$ cycles of phase $Ph_j$, the result of counter 52 must be compared with value $I_i-2$. To count $I_i+1$ cycles of phase $Ph_j$, the result of counter 52 must be compared with value $I_i-1$.

The output of comparator 51 is also sent to the J input of flip-flop 53. Thus, when the output of comparator 51 is at state "1", the output $Ph_j/K_i$ of flip-flop 53 is positioned on "1" at the following rising edge of phase $Ph_j$. The reset of output $Ph_j/K_i$ of flip-flop 53 is triggered by its K input which receives the output $S_{50}$ of comparator 50. Comparator 50 receives the result of counter 52 and the p−1 most significant output bits (MSB) of subtractor 55. In other words, comparator 50 compares the result of counter 52 with value $(I_i/2)-1$ by only taking into account the integer part of this value, since the least significant bit is not used.

FIG. 6 illustrates the operation of the fractional divider according to the invention as shown in FIGS. 3 to 5. For establishing the drawing, the division ratio $K_i$ is assumed to be equal to 21/4. Thus, $Q_i$ is equal to 4, $I_i$ is equal to 5 and $R_i$ is equal to 1. FIG. 6 shows, in the form of timing diagrams, the shape of signals $Ph_j$, $S_{50}$, $S_{51}$, $Ph_j/K_i$, $SUP(Q_i)$, $SUP(Q_i/3)$, $SUP(2Q_i/3)$ and the result issued by counter 52.

As shown by the drawing, the switching to state "1" of signal $S_{51}$, which leads to the switching to state "1" of output $Ph_j/K_i$ at the following rising edge of phase $Ph_j$, is triggered by the rising edge of phase $Ph_j$ where counter 52 is at "3" ($I_i-2$) and, every four periods ($Q_i=4$) of signal $Ph_j/K_i$, where counter 52 is at "4" ($I_i-1$). Signal $S_{51}$ remains at state "1" for a period $T_H$ of phase $Ph_3$.

The switching to state "1" of signal $S_{50}$, which leads to the switching of output $Ph_j/K_i$ to state "0" at the following rising edge of phase $Ph_j$, is triggered by the rising edge of phase $Ph_j$ where counter 52 is at "1" (integer part of $I_i/2-1$). Signal $S_{50}$ remains at state "1" for a period $T_H$ of phase $Ph_j$.

The reset of the output of counter 52 is triggered by the switching to state "1" of signal $S_{51}$, that is, by the rising edge of phase $Ph_j$ following the rising edge which triggered the switching to state "1" of output $S_{51}$.

As concerns accumulator 31, the switching to state "1" of signal $SUP(Q_i/3)$ is triggered at the second rising edge of signal $Ph_j/K_i$ which follows a reset of the counter based on value "4" ($I_i-1$). The switching to state "1" of signal $SUP(2Q_i/3)$ is caused by the following rising edge of signal $Ph_j/K_i$ (time t3), while signal $SUP(Q_i/3)$ remains at state "1". The switching to state "1" of signal $SUP(Q_i)$ is triggered at the same rising edge of signal $Ph_j/K_i$ (time $t_3$), while signals $SUP(Q_i/3)$ and $SUP(2Q_i/3)$ remain at state "1".

Indeed, signal $SUP(Q_i)$ is assumed to switch back to state "0" after a rising edge (time t0) of signal $Ph_j/K_i$, at a time $t'_0$. Signals $SUP(Q_i/3)$ and $SUP(2Q_i/3)$ also switch back to state "0".

As the preceding rising edge of signal $Ph_j/K_i$ has triggered the switching to state "1" of signal $SUP(Q_i)$, at the following rising edge of signal $Ph_j/K_i$ (time $t_1$), the result present at the output of adder 40 is 0001 (0+$R_i$, that is, 000+01).

Thus, at time $t_1$, flip-flop 43 issues the value 001 which corresponds to the q (here, q=3) least significant bits present at the output of adder 40. The output of adder 40 thus becomes 0010 (001+01). The result of the sum of the complement to two [0]100 of the value of $Q_i$ (100) and of the result 0010 issued by adder 40 becomes [0]110. Since the carry is at [0], signal $SUP(Q_i)$ remains at state "0". Multiplexer 42 thus selects the value 010 corresponding to the three least significant bits of adder 40. Moreover, signals $SUP(Q_i/3)$ and $SUP(2Q_i/3)$ remain at state "0" since they are obtained based on the value issued by flip-flop 43, that is, 001.

At the following rising edge of signal $Ph_j/K_i$ (time $t_2$), flip-flop 43 issues the value 010. The output of adder 40 becomes 0011. The sum of the complement to two of the value of $Q_i$ and of the result issued by adder 40 thus becomes [0]111. Signal $SUP(Q_i)$ remains at state "0". Multiplexer 42 selects the three least significant bits 011 of adder 40. Moreover, signal $SUP(Q_i/3)$ switches to state "1" at a time $t'_2$ which is delayed, with respect to time $t_2$, by the time needed to propagate through comparator 44. Signal SUP $(2Q_i/3)$ remains at state "0".

At time $t_3$, flip-flop 43 issues the value 011. The output of adder 40 becomes 0100. The sum of the complement to two of the value of $Q_i$ and of the result issued by adder 40 thus becomes [1]000. Signal $SUP(Q_i)$ thus switches to state "1" at a time $t'_3$ which is delayed, with respect to time $t_3$, by the time needed to propagate through adder 40 and subtractor 41. Multiplexer 42 thus selects the result issued by subtractor 41, that is, 000. Moreover, signal $SUP(2Q_i/3)$ switches to state "1".

At a time $t_4$, flip-flop 43 issues the value 000. The output of adder 40 becomes 0100. The sum of the complement to two of the value of $Q_i$ and of the result issued by adder 40 thus becomes [0]101. Signal $SUP(Q_i)$ thus switches back to state "0" (time $t'_4$), as well as signals $SUP(Q_i/3)$ and $SUP(2Q_i/3)$.

As it can be observed in FIG. 6, times $t_4$ and $t_0$ are separated from each other by 21 periods $T_H$ of fast frequency $F_H$ and 4 cycles of signal $Ph_j/K_i$ are present between times $t_0$ and $t_4$.

It should be noted that the evolution of signals $SUP(Q_i/3)$ and $SUP(2Q_i/3)$ is not directly linked to the evolution of signal $SUP(Q_i)$, and conversely. Indeed, signals $SUP(Q_i/3)$ and $SUP(2Q_i/3)$ have to do with the value issued by the output of flip-flop 43, whereas signal $SUP(Q_i)$ has to do with the carry issued by subtractor 41.

The operating limit of an accumulator 31 according to the invention is set by the time required to propagate through adder 40, subtractor 41 and multiplexer 42. Indeed, a new value must be present at the output of multiplexer 42 before a new rising edge of signal $Ph_j/K_i$ drives flip-flop 43. To implement adder 40 and subtractor 41, so-called interlock adders for performing calculations on groups of bits in parallel will for example be used.

The operating limit of a digital divider 30 according to the invention is set by the time required by the state switching of the output of counter 52 after a rising edge of phase $Ph_j$ and by the propagation through comparators 50 and 51. Indeed, if a rising edge of phase $Ph_j$ happens while outputs $S_{50}$ and $S_{51}$ still have not taken into account the result of counter 52 due to the preceding rising edge of phase $Ph_j$, a counting cycle is lost. Moreover, a digital divider 30 according to the invention operates only if $I_i$ is higher than or equal to 3. Indeed, if not, the output signals $S_{50}$ and $S_{51}$ of comparators 50 and 51 are synchronous when counter 52 counts to $I_i$-2.

As shown by FIG. 6, signal $Ph_j/K_i$ has a phase jitter corresponding to one period $T_H$ of fast frequency $F_H$. This jitter happens $R_i$ times every $Q_i$ periods of signal $Ph_j/K_i$.

FIG. 7 illustrates an embodiment of a jitter compensator according to the invention having the function of reducing the jitter to 1/n (here 1/3) times period $T_H$ of fast frequency For this purpose, each compensator 8, 9 or 10 (FIG. 1) synchronizes, individually, each cycle of signal $Ph_j/K_i$ issued by the associated fractional divider, respectively 5, 6 or 7 on one of the phases $Ph_j$ issued by oscillator 20 (FIG. 2). It is thus ensured that the jitter of the clock signal $CLK_i$ issued by each compensator 8, 9 or 10 with respect to reference frequency $F_{ref}$ is limited, in the example, to one third of period $T_H$ of fast frequency $F_H$ of oscillator 20.

In FIG. 7, the fractional division is assumed to be performed based on phase $Ph_j$. The compensator 8 shown in FIG. 7 will thus correspond, for example, to the compensator of stage 2 of FIG. 1.

The three phases $Ph_1$, $Ph_2$, $Ph_3$ are used to control the dephasing D flip-flops, respectively 60, 61 and 62, included by each compensator 8, 9 or 10. The flip-flops 60 and 61 controlled by phases $Ph_1$ and $Ph_2$ receive, as a D input, the signal $Ph_1/K_i$ issued by fractional divider 5. The flip-flop 62 controlled by phase $Ph_3$ receives, as an input, the non-inverting Q output of flip-flop 61.

The non-inverting Q outputs of flip-flops 60, 61 and 62 are sent to three-state buffers (TSB), respectively 63, 64 and 65. The outputs of registers 63, 64 and 65 are interconnected and constitute the output of the compensator which issues clock signal $CLK_i$.

Each buffer 63, 64 or 65 is controlled by the non-inverting Q output of a control D flip-flop, respectively 66, 67 or 67, sampled (controlled) by signal $Ph_1/K_i$ and which receives, as a D input, an output of a logic decoder DEC 69. The function of decoder 69 is to select, according to the state of signals $SUP(Q_i/3)$ and $SUP(2Q_i/3)$, on which phase $Ph_j$ of fast frequency $F_H$ to synchronize the following rising edge of clock signal $CLK_i$. In other words, buffers 63, 64 and 65 constitute a switch, with three inputs $S_{60}$, $S_{61}$ and $S_{62}$ and one output $CLK_i$, controlled by the output signals $S_{66}$, $S_{67}$ and $S_{68}$ of the D flip-flops, respectively 66, 67 and 68.

Output $S_{66}$ is at state "1" when the result $S_{43}$ (FIG. 4) of modulo-$Q_i$ accumulator 31 is higher than or equal to $Q_i/3$ and lower than $2Q_i/3$. Output $S_{66}$ is, for example, obtained by a logic combination of the XOR type of signals $SUP(Q_i/3)$ and $SUP(2Q_i/3)$.

Output $S_{67}$ is at state "1" when result $S_{43}$ is higher than or equal to 0 and lower than $Q_i/3$. Output $S_{67}$ is, for example, obtained by the inverse of signal $Sup(Q_i/3)$.

Output $S_{68}$ is at state "1" when the result $S_{43}$ is higher than or equal to $2Q_i/3$ and lower than $Q_i$. Output $S_{68}$ corresponds, for example, to signal $SUP(2Q_i/3)$.

The practical implementation of decoder 69 lies within the abilities of those skilled in the art according to the functional indications given above.

If the compensator, for example 9 (FIG. 1), is associated with a fractional divider (for example 6) using phase $Ph_2$, flip-flops 60, 61 and 62 are respectively controlled by phases $Ph_2$, $Ph_3$ and $Ph_1$.

If the compensator, for example 10 (FIG. 1), is associated with a fractional divider (for example 7) using phase Ph3, flip-flops 60, 61 and 62 are respectively controlled by phases $Ph_3$, $Ph_1$ and $Ph_2$.

Flip-flops 60 and 61 always receive, as a D input, the signal $Ph_j/K_i$ of the fractional divider associated with the compensator. Flip-flop 62 always receives, as a D input, the output of flip-flop 61.

To generalize what has been discussed in relation with FIG. 7, the number of dephasing flip-flops, buffers and control flip-flops corresponds to the number n of phases $Ph_j$ issued by oscillator 20 (FIG. 1) of PLL 1.

In a like manner, the number of signals $SUP(Q_i/n)$, $SUP(2Q_i/n)$, . . . , $SUP((n-1)Q_i/n)$, issued by each accumulator 31 and indicating the location of each rising edge of the signal $Ph_j/K_i$ of each digital divider 30 with respect to the quotient by n of the denominator $Q_i$ of the fractional ratio $K_i$, corresponds to n−1. As for the dephasing flip-flops which receive the clock phases $Ph_j$, each flip-flop samples the signal at the frequency $Ph_j/K_i$ that it receives on its D input by the phase $Ph_j$ that it receives on its clock input to obtain, as an output of the dephasing flip-flops, signals at frequency $Ph_j/K_i$ delayed by $xT_H/n$, x taking the values 0, 1, . . . , n−1.

An advantage of the synthesizer according to the present invention is that it enables generation of several clocks $CLK_i$ which are all synchronous with reference frequency $F_{ref}$ and have a phase jitter limited, in the example shown, to one third of period $T_H$ of fast frequency $F_H$ of oscillator 20 of PLL 1.

Another advantage of the present invention is that all the components of the different stages of teh synthesizer are identical for a same PLL 1. Indeed, all accumulators 31, digital dividers 30 and jitter compensators of the synthesizer according to the invention can be implemented in exactly the same way for all the stages. The operation of the fractional dividers is programmable by the values $I_i$−1, $Q_i$ and $R_i$ which are introduced therein. Moreover, only the connections of the D inputs of the dephasing flip-flops of the compensators depend on the phases $Ph_j$ used by the fractional dividers to which the compensators are respectively associated. This makes the synthesizer according to the invention easy to integrate.

FIG. 8 illustrates the operation of a frequency synthesizer according to the invention. For reasons of clarity, only signals useful for generating the signal $CLK_i$ generated by first stage 2 have been shown. FIG. 8 shows, in the form of timing diagrams, the shapes of signals $Ph_1$, $Ph_2$, $Ph_3$, $Ph_1/K_1$, $SUP(Q_1/3)$, $SUP(2Q_1/3)$, $S_{60}$, $S_{61}$, $S_{62}$, $S_{66}$, $S_{67}$, $S_{68}$ and $CLK_1$. In the example shown, the division ratio $K_1$ is assumed to be equal to 15/4. That is, $I_1$ is assumed to be equal to 3, $Q_1$ is assumed to be equal to 4 and $R_1$ is assumed to be equal to 3.

The obtaining of signals $Ph_1/K_1$, $SUP(Q_1/3)$, $SUP(2Q_1/3)$ can be derived from the discussion of the operation of the fractional divider in relation with FIGS. 3 to 6. Although it has not been shown, signal $SUP(Q_1)$ is at state "1" three ($R_1$=3) cycles of signal $Ph_1/K_1$ out of four ($Q_1$=4).

Signal $S_{60}$ corresponds to signal $Ph_1/K_1$ delayed by one period $T_H$ of fast frequency $F_H$.

Signal $S_{61}$ corresponds to signal $Ph_1/K_1$ delayed by 2/3 of a period $T_H$ of fast frequency $F_H$.

Signal $S_{62}$ corresponds to signal $S_{61}$ delayed by 2/3 of a period $T_H$ of fast frequency $F_H$, that is, to signal $Ph_1/K_1$ delayed by 4/3 of a period $T_H$ of fast frequency $F_H$.

Signal $S_{66}$ is at state "1" when signal $SUP(Q_1/3)$ is at state "1" and signal $SUP(2Q_1/3)$ is at state "0", but with a delay of one cycle of signal $Ph_1/K_1$. Indeed, although decoder 69 positions the D input of flip-flop 66 as soon as signals $SUP(Q_1/3)$ and $SUP(2Q_1/3)$ are respectively at state "1" and at state "0", flip-flop 66 is controlled by signal $Ph_1/K_1$.

Signal $S_{67}$ is at state "1" when signals $SUP(Q_1/3)$ and $SUP(2Q_1/3)$ are at state "0", and is also delayed by one cycle of signal $Ph_1/K_1$.

Signal $S_{68}$ is at state "1" when signals $SUP(Q_1/3)$ and $SUP(2Q_1/3)$ are at state "1", and is also delayed by one cycle of signal $Ph_1/K_1$.

Buffers 63, 64 and 65 are controlled by signals $S_{66}$, $S_{67}$ and $S_{68}$, respectively. Signal $CLK_1$ is generated from the three signals $S_{60}$, $S_{61}$ and $S_{62}$ which are selected according to signals $S_{66}$, $S_{67}$ and $S_{68}$.

As it can be observed, the phase jitter of signal $CLK_1$ corresponds to one third of a period $T_H$ of fast frequency $F_H$.

The operation illustrated above is the same for the two other stages 3 and 4, using the adapted phase $Ph_j$.

It should be noted that the output signals of the dephasing flip-flops are, in fact, all delayed, with respect to signal $Ph_j/K_i$, by a time $T_0$ added to the delay $xT_H/n$. This fixed additional delay $T_0$ has to do with the prepositioning and holding times of the flip-flops. Indeed, for a high frequency $F_H$, signal $Ph3/K_i$ cannot be delayed by a value $T_H/n$ by the mere sampling with a clock phase delayed by $T_H/n$. As the delays generated are necessarily multiples of $T_H/n$, the fixed additional delay $T_0$ also is a multiple of $T_H/n$. Thus, the n output signals of the different dephasing flip-flops correspond to signal $Ph_j/K_i$ delayed by $T_0$, $T_0+T_H/n$, . . . , $T_0+xT_H/n$, . . . , $T_0+(n-1)T_H/n$, where $T_0$ is an integer multiple $\alpha$ of the minimum delay $\beta T_H/n$ that can be obtained by means of the flip-flops due to their prepositioning and holding times ($T_0=\alpha\beta T_H/n$). In other words, the output signal of a flip-flop of rank x corresponds to signal $Ph_j/K_i$ delayed by $T_0+xT_H/n$ with x taking the values 0, 1, 2, . . . , n−1. The multiplication coefficient $\beta$ must conform with the condition $\alpha \geq (\beta-1)/(n-\beta)$.

In the example shown in FIG. 8, n=3 and $\beta$=2. That is, signal $S_{60}$ is obtained by using the rising edge of signal $Ph_1$. Among the output signals of the dephasing flip-flops, the closest to signal $T_H/n$ is signal $S_{61}$ which is delayed by $2T_H/3$ with respect to $Ph_1/K_i$. The multiplication coefficient $\alpha$ is equal to 1. The condition $\alpha \geq (\beta-1)/(n-\beta)$ is actually met. The output signals of flip-flops 60, 61 and 62 correspond to $Ph_1/K_i$ delayed by $T_0$, that is, $Ph_1/K_i$ delayed by $2T_H/3$ ($S_{61}$), to $Ph_1/K_i$ delayed by $T_0+T_H/3$, that is, $Ph_1/K_i$ delayed by $T_H$ ($S_{60}$) and $Ph_1/K_i$ delayed by $T_0+2T_H/3$, that is, $Ph_1/K_i$ delayed by $4T_H/3$ ($S_{62}$).

If, for example, oscillator 20 delivers 9 clock phases (n=9) and if the minimum delay likely to be obtained between two samplings by means of the flip-flops is $7T_H/9$ ($\beta$=7), multiplication coefficient $\alpha$ will be equal to 3. Indeed, 3 is the smallest integer which is higher than or equal to $(\beta-1)/(n-\beta)$. The 9 output signals of the flip-flops receiving the nine phases $Ph_j$ will be delayed by $21T_H/9$, $22T_H/9$, $23T_H/9$, $24T_H/9$, $25T_H/9$, $26T_H/9$, $27T_H/9$, $28T_H/9$, $29T_H/9$.

It should be noted that if $T_0$ is higher than or equal to $T_H$, the output signals of the control flip-flops of the three state buffers have to be delayed by $T_0$.

The fast frequency $F_H$ of the oscillator is, for example, included between approximately 150 and 300 MHz and the reference frequency $F_{ref}$ is, for example, included between approximately 500 kHz and 40 MHz. The fractional dividers are, for example, realized so as to function in a range of values $I_i$ from 3 to 16. In this case, the counters 52 of the digital dividers 30 are counters over 4 bits since they count to $I_i$−1.

As a specific example of implementation, applied to generating clock signals for an MPEG decoder, frequency $F_H$ of oscillator 20 is around 250 MHz and reference frequency $F_{ref}$ is around 10 MHz.

Of course, the present invention is likely to have various alterations and modifications, which will readily occur to those skilled in the art. Particularly, each of the components described can be replaced by one or several elements assuming the same function.

Further, the number n of phases $Ph_j$ issued by oscillator 20 can be modified according to the maximum jitter to which the jitter of the clock signals $CLK_i$ issued is desired to be limited. The jitter compensators and the accumulators 31 of the fractional dividers will then be accordingly adapted.

In addition, although reference has been made in the preceding description to a synthesizer including a number of stages identical to the number n of phases $Ph_j$ issued by oscillator 20, the number of stages can be modified, provided that it remains a multiple of the number n of phases $Ph_j$ and that a same number m of fractional dividers uses each phase $Ph_j$ of fast frequency $F_H$.

Such alterations, modifications, and improvements are intended to be part of this disclosure, and are intended to be within the spirit and the scope of the invention. Accordingly, the foregoing description is by way of example only and is not intended to be limiting. The invention is limited only as defined in the following claims and the equivalent thereto.

What is claimed is:

1. A frequency synthesizer including a phase-locked loop having one oscillator which supplies an odd number n of phases with increasing delays of a fast clock signal synchronized on a reference frequency, wherein each of the said n phases is sent onto a same number m of programmable fractional dividers having their respective outputs sent onto m jitter compensators, each of which issues, based on said n phases, a clock signal synchronized on said reference frequency.

2. A frequency synthesizer according to claim 1, wherein each fractional divider includes a programmable digital divider which issues an output signal at a frequency corresponding, modulo the denominator of the fractional division ratio, to the fast frequency divided by said fractional ratio, and a programmable accumulator which issues n−1 signals indicating the position of each rising edge of said output signal of the digital divider with respect to quotient, by the number n of phases, of the denominator of said fractional ratio.

3. A frequency synthesizer according to claim 2, wherein said accumulator configures said digital divider between an operating mode where it divides said fast frequency by the integer part of said fractional division ratio and an operating mode where it divides said fast frequency by said integer part plus one, said accumulator being synchronized by said output signal of said digital divider.

4. A frequency synthesizer according to claim 3, wherein the integer part of the fractional division ratio is at least equal to 3.

5. A frequency synthesizer according to claim 3, wherein said digital divider is programmed by said integer part, minus one, and receives said phase used by said fractional divider to which it is integrated, said accumulator being programmed by the denominator of said fractional division ratio as well as by the remainder of the division of the numerator of said fractional ratio by said denominator.

6. A frequency synthesizer according to claim 2, wherein each jitter compensator includes a switch, with n inputs and one output, controlled by n signals issued by n D flip-flops sampled by said output signal of said digital divider to which the compensator is associated, each control flip-flop receiving an output of a logic decoder which receives, as an input, said n−1 signals issued by said accumulator.

7. A frequency synthesizer according to claim 6, wherein each input of said switch is connected to an output of a dephasing D flip-flop, a first dephasing flip-flop being controlled by the phase of the fast frequency which is used by the fractional divider associated with the compensator involved, the other dephasing flip-flops being each controlled by another one of said phases of the fast frequency.

8. A frequency synthesizer according to claim 6, wherein all the jitter compensators and all the fractional dividers have an identical constitution, two stages of the synthesizer being distinguished by the phase received by the first dephasing flip-flop of their jitter compensator and/or by the values introduced to program their fractional divider.

9. A frequency synthesizer according to claim 1, wherein said oscillator of the phase-locked loop issues three phases of the fast frequency.

* * * * *

UNITED STATES PATENT AND TRADEMARK OFFICE
CERTIFICATE OF CORRECTION

PATENT NO. : 5,668,504
DATED : September 16, 1997
INVENTOR(S) : Rui Paulo Rodrigues Ramalho It is certified that error appears in the above-indentified patent and that said Letters Patent is hereby corrected as shown below:

On the title page, under item [19] the inventor's name should read:

Rodrigues Ramalho

On the title page, item [75] should read:

[75] Rui Paulo Rodrigues Ramalho, Grenoble, France

Signed and Sealed this

Seventh Day of July, 1998

*Attest:*

BRUCE LEHMAN

*Attesting Officer*  *Commissioner of Patents and Trademarks*